United States Patent
Hong et al.

(10) Patent No.: US 7,954,033 B2
(45) Date of Patent: May 31, 2011

(54) DECODING APPARATUS AND METHOD IN A COMMUNICATION SYSTEM USING LOW DENSITY PARITY CHECK CODES

(75) Inventors: Song-Nam Hong, Seoul (KR); Pan-Yuh Joo, Seoul (KR); Jung-Je Son, Seongnam-si (KR); Jae-Weon Cho, Suwon-si (KR); Hyoung-Kyu Lim, Seoul (KR); Yeong-Moon Son, Anyang-si (KR); Sung-Jin Lee, Suwon-si (KR); Mi-Hyun Lee, Seoul (KR); Hyun-Jeong Kang, Seoul (KR); Young-Ho Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 1247 days.

(21) Appl. No.: 11/590,595

(22) Filed: Oct. 31, 2006

(65) Prior Publication Data

US 2007/0113148 A1    May 17, 2007

(30) Foreign Application Priority Data

Oct. 31, 2005   (KR) .................. 10-2005-0103229

(51) Int. Cl.
*H03M 13/00* (2006.01)
(52) U.S. Cl. .................. 714/755; 714/790; 714/786
(58) Field of Classification Search .......... 714/755, 714/786, 790
See application file for complete search history.

(56) References Cited

U.S. PATENT DOCUMENTS

| | | | |
|---|---|---|---|
| 2003/0081690 A1* | 5/2003 | Kim et al. ............ | 375/264 |
| 2004/0268205 A1* | 12/2004 | Stolpman ............ | 714/758 |
| 2005/0149840 A1 | 7/2005 | Lee et al. | |
| 2005/0149841 A1 | 7/2005 | Kyung et al. | |
| 2005/0149845 A1 | 7/2005 | Shin et al. | |
| 2008/0059862 A1* | 3/2008 | Kyung et al. ........ | 714/752 |

FOREIGN PATENT DOCUMENTS

| | | |
|---|---|---|
| KR | 1020050044963 | 5/2005 |
| KR | 1020050046471 | 5/2005 |
| KR | 1020050063660 | 6/2005 |

* cited by examiner

*Primary Examiner* — Guy J Lamarre
(74) *Attorney, Agent, or Firm* — The Farrell Law Firm, P.C.

(57) ABSTRACT

A decoding method in a communication system using a Low Density Parity Check (LDPC) code. The method includes determining whether an LDPC codeword to be decoded is a general LDPC codeword to which a puncturing scheme is not applied or a punctured LDPC codeword to which the puncturing scheme is applied; if the LDPC codeword to be decoded is the punctured LDPC codeword, generating a child parity check matrix according to a mother parity check matrix indicative of a parity check matrix of the general LDPC codeword, and a puncturing pattern applied to the punctured LDPC codeword; and decoding the punctured LDPC codeword according to the child parity check matrix.

14 Claims, 10 Drawing Sheets

| | | | | | | | | | | | | | | | | | | |
|---|---|---|---|---|---|---|---|---|---|---|---|---|---|---|---|---|---|---|
| -1 | (94,27) | 73 | -1 | 22 | 79 | -1 | 9 | 55 | 83 | -1 | -1 | -1 | -1 | -1 | -1 | -1 | -1 | -1 |
| 61 | -1 | 47 | 24 | 22 | 81 | -1 | 33 | 65 | 25 | -1 | 0 | -1 | 0 | 0 | -1 | -1 | -1 | -1 |
| -1 | -1 | 39 | -1 | 46 | 40 | 84 | 82 | -1 | 41 | 72 | 79 | 0 | -1 | -1 | 0 | -1 | -1 | -1 |
| -1 | 11 | 95 | 33 | -1 | -1 | 2 | -1 | -1 | (14,47) | 18 | -1 | -1 | -1 | -1 | 0 | 0 | 0 | -1 |
| 12 | -1 | -1 | -1 | 83 | (24,94) | -1 | (43,59) | -1 | -1 | 70 | (51,72) | -1 | -1 | -1 | -1 | -1 | 0 | 0 |
| 43 | -1 | 7 | 65 | -1 | 66 | -1 | 41 | 39 | 49 | -1 | 26 | 7 | 0 | -1 | -1 | -1 | -1 | 0 |

| 61 | (94,27) | (73,47) | 24 | 22 | (22,81) | 79 | (9,33) | (55,65) | (83,25) | -1 | -1 | 7 | 0 | -1 |
|---|---|---|---|---|---|---|---|---|---|---|---|---|---|---|
| -1 | 11 | (39,95) | 33 | 46 | 40 | (84,2) | 82 | -1 | (41,14,47) | (72,18) | 79 | 0 | 0 | 0 |
| (12,43) | -1 | 7 | 65 | 83 | (24,94,66) | -1 | (43,59,41) | 39 | 49 | 70 | (51,72,26) | 7 | -1 | 0 |

FIG.5

DECODING APPARATUS AND METHOD IN A COMMUNICATION SYSTEM USING LOW DENSITY PARITY CHECK CODES

PRIORITY

This application claims the benefit under 35 U.S.C. §119 of an application filed in the Korean Intellectual Property Office on Oct. 31, 2005 and assigned Serial No. 2005-103229, the entire contents of which are incorporated herein by reference.

BACKGROUND OF THE INVENTION

1. Field of the Invention

The present invention relates generally to a decoding apparatus and method in a communication system using Low Density Parity Check (LDPC) codes, and in particular, to a decoding apparatus and method in a communication system using Repeat Accumulate (RA) Type-LDPC (RT-LDPC) codes.

2. Description of the Related Art

The next generation mobile communication system has evolved into a packet service communication system, which is a system for transmitting burst packet data to a plurality of mobile stations (MSs), has been designed to be suitable for transmission of bulk data. In particular, various schemes such as a Hybrid Automatic Repeat reQuest (HARQ) scheme and Adaptive Modulation and Coding (AMC) scheme have been proposed to increase the data throughput. Because HARQ and AMC schemes support variable coding rate, there is a need to support various coding rates. Also, there are various schemes proposed for supporting the variable coding rate, i.e. for supporting various coding rates using one mother codeword. The proposed typical schemes include the shortening and puncturing schemes. The mother codeword is composed of an information word, i.e. an information part corresponding to information bits, and parity, i.e. a parity part corresponding to parity bits.

The shortening scheme, a scheme for decreasing a coding rate by shortening only the information word from the mother codeword, i.e. by shortening only the information bits in the information part, is useful for obtaining various coding rates for various codeword lengths. The puncturing scheme increases a coding rate by transmitting only a part of the parity in the mother codeword, instead of transmitting all parity bits in the parity part. Generally, the shortening scheme and the puncturing scheme are used to support variable coding rate for the case where various codes, for example, convolutional code, turbo code and an LDPC code, are used.

The puncturing scheme will now be described in detail herein below.

When the puncturing scheme is used, a transmitter selects only some of the whole parity bits from the mother codeword according to a corresponding coding rate and transmits the selected parity bits to a receiver together with information bits. Even though the transmitter actually transmitted only some of the parity bits using the puncturing scheme, the receiver performs decoding, considering that '0' values were received at the position corresponding to the parity bits punctured in the receiver. That is, the receiver inserts '0's in the position corresponding to the punctured parity bits before performing the decoding.

As described above, the puncturing scheme is generally used for the LDPC code. A description will now be made of a comparison between a puncturing codeword and an LDPC codeword having the same coding rate as the punctured LDPC codeword. For convenience, the LDPC codeword to which the puncturing scheme is not applied will be referred herein as a 'general LDPC codeword', and applying the puncturing scheme to the general LDPC codeword generates the punctured LDPC codeword.

First, the punctured LDPC codeword, compared with the general LDPC codeword having the same coding rate, has a larger number of variable nodes and check nodes in a Tanner graph, so it needs more calculations for decoding.

Second, decoding on the punctured LDPC codeword, compared with decoding on the general LDPC codeword, decreases in its decoding convergence speed due to the punctured nodes. The reason is as follows.

When the punctured LDPC codeword is decoded, '0's are inserted as initial values of the punctured parity nodes corresponding to the punctured parity bits, so a message delivered from a check node connected to each of the punctured parity nodes to the variable node always transmits a '0' value until the values of the punctured parity nodes are updated. That is, an update speed of the message delivered from the check node connected to the punctured parity node to the variable node decreases, thereby reducing the entire decoding convergence speed. During decoding, an increase in the number of iterations improves performance of the punctured LDPC codeword. If the number of iterations is infinitely large, the decoding convergence speed never affects the performance of the punctured LDPC codeword. However, in the general communication system, because the number of iterations is limited, a decrease in the decoding convergence speed of the punctured LDPC codeword causes degradation of the performance.

In order to use the punctured LDPC codeword in the general communication system, it is necessary to solve the problem of increased calculations and decreasing decoding convergence speed during decoding of the punctured LDPC codeword. Therefore, there is a need for a decoding scheme of a punctured LDPC codeword, capable of reducing the decoding calculations and the decoding convergence speed.

SUMMARY OF THE INVENTION

It is, therefore, an object of the present invention to provide a decoding apparatus and method in a communication system using an LDPC code.

It is another object of the present invention to provide a decoding apparatus and method for reducing calculations for decoding in a communication system using an LDPC code.

It is another object of the present invention to provide a decoding apparatus and method for increasing a decoding convergence speed in a communication system using an LDPC code.

According to one aspect of the present invention, there is provided a decoding apparatus in a communication system using a Low Density Parity Check (LDPC) code. The apparatus includes a controller for determining whether an LDPC codeword to be decoded is a general LDPC codeword to which a puncturing scheme is not applied or a punctured LDPC codeword to which the puncturing scheme is applied, and if the LDPC codeword to be decoded is the punctured LDPC codeword, generating a child parity check matrix according to a mother parity check matrix indicative of a parity check matrix of the general LDPC codeword, and a puncturing pattern applied to the punctured LDPC codeword; and an LDPC decoder for decoding the punctured LDPC codeword according to the child parity check matrix.

According to another aspect of the present invention, there is provided a decoding method in a communication system using a Low Density Parity Check (LDPC) code. The method includes determining whether an LDPC codeword to be decoded is a general LDPC codeword to which a puncturing scheme is not applied or a punctured LDPC codeword to which the puncturing scheme is applied; if the LDPC codeword to be decoded is the punctured LDPC codeword, generating a child parity check matrix according to a mother parity check matrix indicative of a parity check matrix of the general LDPC codeword, and a puncturing pattern applied to the punctured LDPC codeword; and decoding the punctured LDPC codeword according to the child parity check matrix.

BRIEF DESCRIPTION OF THE DRAWINGS

The above and other objects, features and advantages of the present invention will become more apparent from the following detailed description when taken in conjunction with the accompanying drawings in which:

FIG. 3 is a diagram illustrating a parity check matrix of a general B-LDPC codeword with coding rate=½;

FIG. 4 is a diagram illustrating a parity check matrix of a punctured B-LDPC codeword with coding rate=⅔ generated by applying a puncturing scheme to a general B-LDPC codeword with coding rate=½;

FIG. 5 is a diagram illustrating a parity check matrix of a punctured B-LDPC codeword with coding rate=⅘ generated by applying a puncturing scheme to a general B-LDPC codeword with coding rate=½;

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention provides a decoding apparatus and method in a communication system using Low Density Parity Check (LDPC) codes, for example, Repeat Accumulate (RA) Type-LDPC (RT-LDPC) codes. In particular, the present invention provides an apparatus and method for decoding a punctured RT-LDPC codeword in a communication system using RT-LDPC codes in which the puncturing scheme is used to support variable coding rate. Although the present invention will be described herein with reference to the communication system using RT-LDPC codes, the RT-LDPC decoding apparatus and method proposed in the present invention can also be applied to any other communication systems using the codes for which the puncturing scheme is available. For convenience, the RT-LDPC codeword to which the puncturing scheme is not applied will be referred herein as a 'general RT-LDPC codeword'. That is, the punctured RT-LDPC codeword is generated by applying the puncturing scheme to the general RT-LDPC codeword.

Before a description of the RT-LDPC decoding apparatus and method proposed in the present invention is given, a description will be made again of the problem of increased calculations and decreased decoding convergence speed when the punctured RT-LDPC codeword is decoded.

Figure 1:
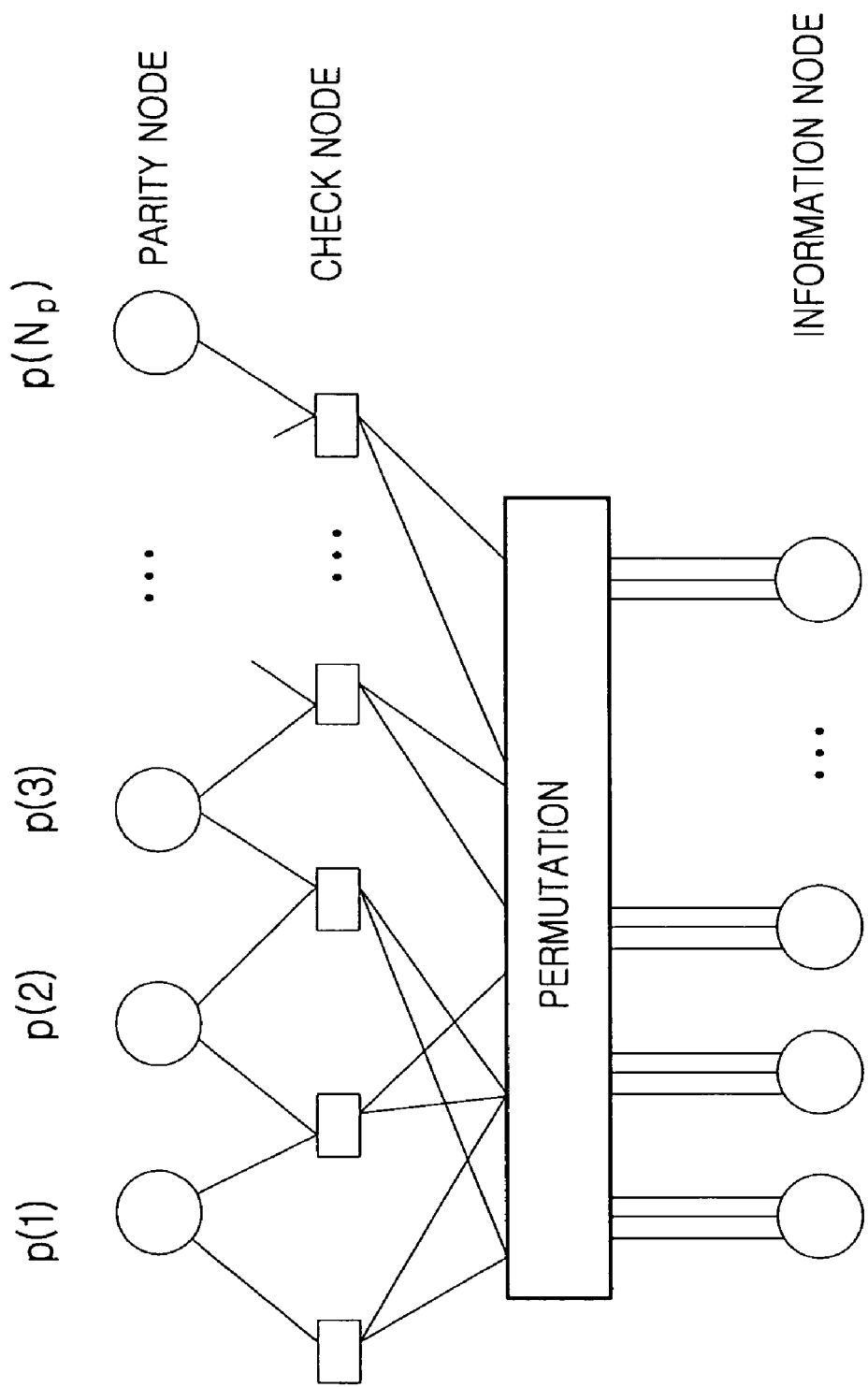
FIG. 1 is a diagram illustrating a Tanner graph of a general RT-LDPC code.

Before a description of FIG. 1 is given, it should be noted that an RT-LDPC codeword, or a mother codeword, includes an information word, i.e. an information part corresponding to information bits, and parity, i.e. a parity part corresponding to parity bits. In FIG. 1, the parity bits included in the RT-LDPC codeword are shown by $p(i)$ (for $i=1,\ldots,N_p$), and a set of the information bits connected to each check node is denoted by $G(i)$ (for $i=1,\ldots,N_p$). For example, if it is assumed that information bits $I_1, I_2, I_3$ are connected to a first check node, a set of the information bits connected to the first check node is $G(1)=(I_1, I_2, I_3)$.

A puncturing pattern is expressed by, for example, the binary numbers '1' and '0', and the parity bits corresponding to '0's in the puncturing pattern are punctured parity bits. For example, if it is assumed that an $x^{th}$ parity bit is punctured, then $p(x)=0$. In this case, for the $x^{th}$ parity bit, because there is no value received at a receiver through a channel, a Log Likelihood Ratio (LLR) value determined by the value received through the channel is $ch(p(x))=0$.

The RT-LDPC decoding apparatus inserts, as initial values, '0's in corresponding parity nodes of a received punctured RT-LDPC codeword according to a predetermined puncturing pattern, and then performs decoding thereon based on a sum-product algorithm. For this reason, the punctured RT-LDPC code, compared with the general RT-LDPC code having the same coding rate, increases in the number of calculations required for each iteration and decreases in the decoding convergence speed.

For example, assume that an RT-LDPC code with coding rate=½ is generated by applying the puncturing scheme to a general RT-LDPC codeword with coding rate=⅓, and the number of its information bits is 100. Because the number of the information bits is 100, the RT-LDPC code generated from the general RT-LDPC codeword with coding rate=⅓ has 200 parity bits. In order to generate the RT-LDPC code with coding rate=½ using the general RT-LDPC codeword with coding rate=⅓, it is necessary to puncture 100 parity bits among 200 parity bits of the general RT-LDPC codeword with coding rate=⅓.

In this case, a comparison between the punctured RT-LDPC codeword with coding rate=½, generated by puncturing the general RT-LDPC codeword with coding rate=⅓, and the general RT-LDPC codeword with coding rate=½ will be made herein below in terms of the number of calculations required for each iteration.

(1) For the punctured RT-LDPC codeword with coding rate=½

Various node calculations: 300

Check node calculations: 200

(2) For the general RT-LDPC codeword with coding rate=½

Various node calculations: 200

Check node calculations: 100

That is, the punctured RT-LDPC codeword with coding rate=½, compared with the general RT-LDPC codeword with coding rate=½, additionally needs as many variable node calculations and check node calculations as the number, 100, of the information bits. Because the increase in the number of calculations increases the power consumption of the RT-LDPC decoding apparatus and reduces the decoding convergence speed, the increase in the number of calculations may considerably deteriorate the performance of the punctured RT-LDPC codeword.

A description will now be made of the reason why the decoding convergence speed of the punctured RT-LDPC codeword decreases.

A value of the message delivered from a check node connected to parity nodes punctured at first iteration to an information node is 0, and can be expressed as Equation (1):

$$m_u = \log\left(\frac{1 + \prod_i \tanh\frac{1}{2}m_i}{1 - \prod_i \tanh\frac{1}{2}m_i}\right) \quad (1)$$

In Equation (1), $m_u$ denotes a message value delivered from a check node to a variable node (information node or parity node), and $m_i$ denotes a message value delivered from the variable node (information node or parity node) to the check node.

In conclusion, Equation (1) represents the calculation process at the check node, and it can be noted from Equation (1) that if any one of $m_i$ for all i is 0, $m_u$ is 0. However, because a value of $m_i$ corresponding to the parity nodes punctured at the first iteration is 0, a message value $m_u$ delivered from the check node connected to the information node is 0.

If it is assumed that a number 'a' of consecutive parity bits were punctured from the general RT-LDPC codeword, the message value delivered from the check node connected to the punctured parity node, located in an $(a/2)^{th}$ position at $(a/2)^{th}$ iteration, to the information node is 0. That is, it can be noted that as the number of punctured parity nodes is larger, especially as the positions of the punctured parity nodes are close to each other, a reduction in the decoding convergence speed is more considerable. A relationship between the number or positions of the punctured parity nodes and the decoding convergence speed can be found through the density evolution scheme or simulation. When there are punctured parity nodes in the RT-LDPC codeword, the decoding convergence speed decreases. The relationship between the number or positions of the punctured parity nodes and the decoding convergence speed is hot directly related to the gist of the present invention, a description thereof will be omitted.

Therefore, the present invention provides a decoding apparatus and method capable of solving the problems of the increase in the number of calculations and the decrease in the decoding convergence speed when the punctured RT-LDPC codeword is decoded. A detailed description thereof will be made herein below.

In the Tanner graph of the general RT-LDPC code, variable nodes connected to a check node always satisfy even parity. Using this characteristic, the following Equation (2) to Equations (4) are derived using the information node and the parity nodes for the RT-LDPC code.

Equation (2)

$$p(j) = p(j-1) + \sum_{i=1}^{n-2} g(i, j-1) \bmod 2 \quad (2)$$

$$p(j+1) = p(j) + \sum_{i=1}^{n-2} g(i, j) \bmod 2$$

In Equation (2), g(i,j) denotes a $j^{th}$ information node among the information nodes connected to an $i^{th}$ check node, and a degree of the $i^{th}$ check node is assumed to be 'n'. In addition, 'mod' denotes a modulo operation.

Equation (3)

$$p(j+1) = p(j-1) + \sum_{i=1}^{n-2} (g(i, j) + g(i, j-1)) \bmod 2 \quad (3)$$

Equation (3) can be derived from Equation (2), and Equation (3) can be extended to Equation (4)

$$p(j+1) = p(j-t) + \sum_{i=1}^{n-2} (g(i, j) + g(i, j-1) + \ldots + g(i, j-t)) \bmod 2 \quad (4)$$

Figure 2:
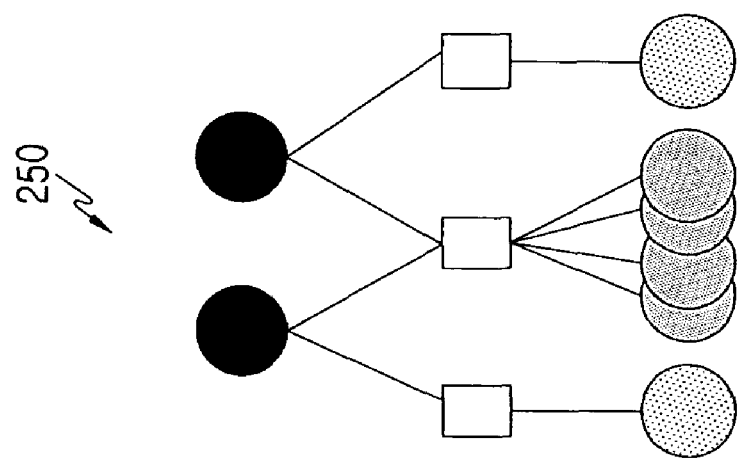
FIG. 2 is a Tanner graph illustrating check node combination of a punctured RT-LDPC code according to the present invention.
Figure 2:
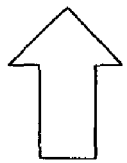
Figure 2:
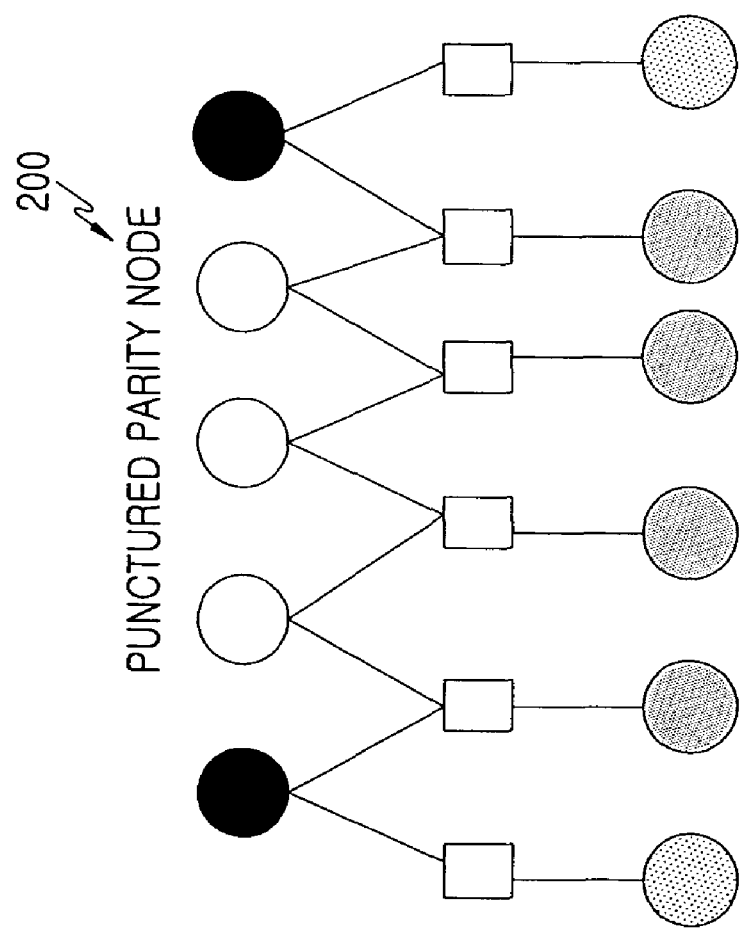

While Equation (2) and Equation (3) can be applied to all kinds of LDPC codes, Equation (4) can be applied only to the RT-LDPC code and is an important Equation for increasing decoding efficiency of the RT-LDPC code. With reference to FIG. 2, a description will now be made of Equation (2) to Equation (4).

In the Tanner graph illustrated in FIG. 2, 6 information bits are assumed to be 100100. In the Tanner graph shown in the left side of FIG. 2, 5 parity bits p(i) can be expressed as Equation (5) resulting from evaluating Equation 2.

p(1)=1 mod 2=1 p(2)=1+0 mod 2=1 p(3)=1+0 mod 2=1 p(4)=1+1 mod 2=0 p(5)=0+0 mod 2=0     (5)

Further, in the Tanner graph shown in the left side of FIG. 2, it is assumed that a second parity bit p(2), a third parity bit (p3) and a fourth parity bit (p4) were punctured. In the Tanner graph shown in the right side of FIG. 2, two parity bits are denoted by q(i), and can be expressed as Equation (6) resulting from evaluating Equation (4)

q(1)=1 mod 2=1 q(2)=1+0+0+1+0 mod 2=0     (6)

As shown in Equation (5) and Equation (6), it can be understood that p(1)=q(1) and p(5)=q(2).

The RT-LDPC decoding apparatus can detect a channel value corresponding to each of the 6 information bits, and channel values corresponding to the parity bits p(1) and p(5). Because p(1)=q(1) and p(5)=q(2) as stated above, the RT- LDPC decoding apparatus can perform decoding on the received value according to the Tanner graph shown in the right side of FIG. 2. Because the Tanner graph shown in the right side of FIG. 2 does not include punctured parity nodes, the RT-LDPC decoding apparatus can prevent the increase in the number of calculations and the decrease in the decoding convergence speed due to the punctured parity nodes.

It can be understood from FIG. 2 that the Tanner graph including the punctured parity nodes can be transformed into a Tanner graph not including the parity nodes punctured by Equation (4). Herein, the transform of the Tanner graph means transform of a parity check matrix.

Next, the description will be made of an operation to generate a parity check matrix of a punctured RT-LDPC code using a predetermined puncturing pattern and a parity check matrix of a general RT-LDPC code. Preferably, the parity check matrix of the punctured RT-LDPC code should be smaller in size than the parity check matrix of the general RT-LDPC code, and should not include the punctured parity nodes.

The Institute of Electrical and Electronics Engineers (IEEE) 802.16e communication system is a standard to transmit/receive signals using a block LDPC (B-LDPC) code, which is a kind of the RT-LDPC code. Therefore, a description will be made of an exemplary operation of generating a parity check matrix of the punctured RT-LDPC code using the B-LDPC code.

The B-LDPC code will first be described herein below.

Figure 3:
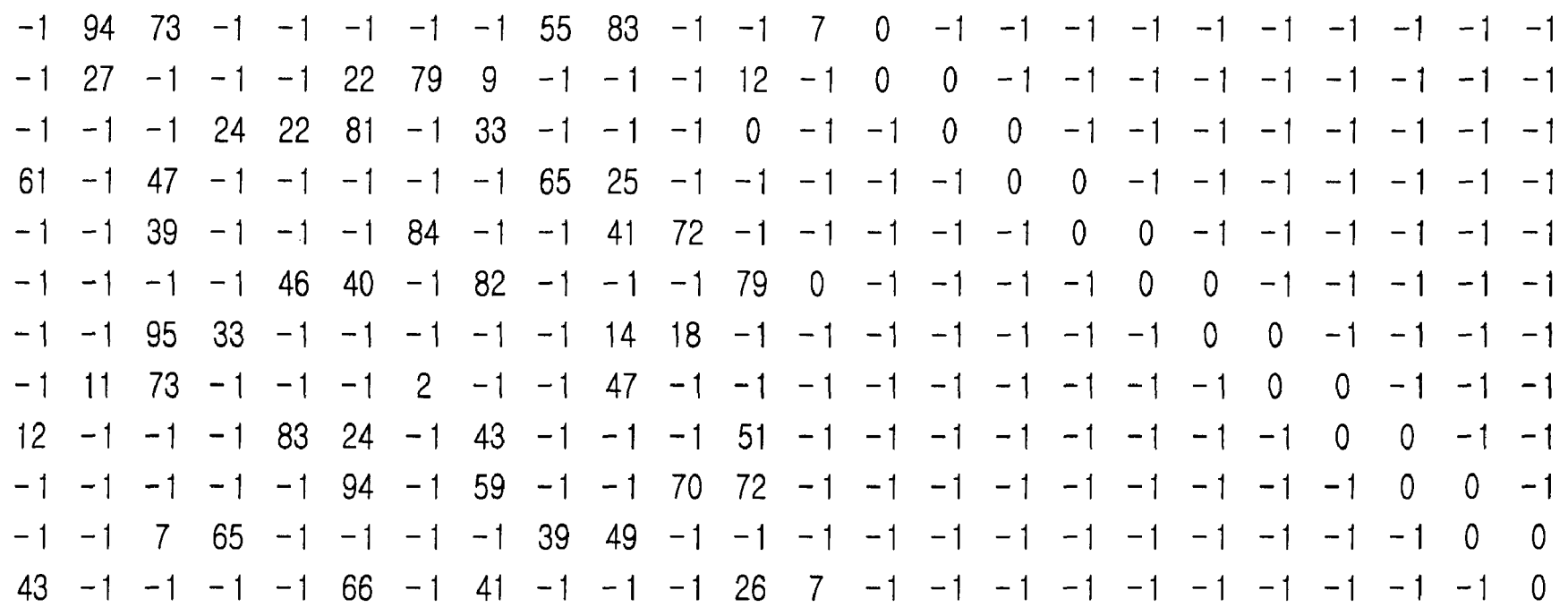

The B-LDPC code is an LDPC code for which not only the efficient coding, but also efficient storage and performance improvement of the parity packet matrix are taken into consideration. The B-LDPC code is an LDPC code obtained by generalizing and extending the structure of a regular LDPC code. A parity check matrix of the B-LDPC code has the format obtained by dividing the entire parity check matrix into a plurality of blocks and mapping a permutation matrix to each of the blocks. The permutation matrix is an L×L square matrix. In the permutation matrix, each of its L rows has a weight of 1, and each of its L columns also has a weight of 1. If the permutation matrix is denoted by $P^a$, where the superscript 'a'=0, i.e. the permutation matrix $P^0$, represents an identity matrix $I_{L \times L}$, and the permutation matrix $P^a$ with superscript 'a'=∞, i.e. the permutation matrix $P^\infty$, represents a zero matrix. Herein, $I_{L \times L}$ indicates an L×L identity matrix. With reference to FIG. 3, a description will now be made of the parity check matrix of the B-LDPC code.

Referring to FIG. 3, each of the numerals shown indicates a superscript 'a' of each of the permutation matrix included in the parity check matrix of the general B-LDPC codeword with coding rate=½. The parity check matrix shown in FIG. 3 is a base matrix of a parity check matrix used for generating a general B-LDPC codeword with coding rate=½, and parity bits of the B-LDPC codeword with coding rate=½ are grouped into 12 parity groups. A parity group corresponding to a first row of the base matrix will be denoted by $G_p(1)$. Herein, $G_p(1)=1$ indicates that all parity bits in the $G_p(1)$ were punctured.

A description will now be made of an operation of generating a punctured B-LDPC codeword with coding rate=⅔ by applying the puncturing scheme to the general B-LDPC codeword with coding rate=½.

If the puncturing scheme is applied, ½ of parity bits of the general B-LDPC codeword with coding rate=½ should be punctured, and a puncturing pattern for guaranteeing the excellent performance of the punctured B-LDPC codeword with coding rate=⅔ can be expressed as Equation (7):

$$G_p(2i)=0, i=1,2,3,4,5,6 \quad (7)$$

In order to transform the Tanner graph of the B-LDPC codeword so as not to include the punctured parity nodes as described above, an operation of deleting the punctured parity nodes should be performed.

Herein, $r_i$ will be referred to as an $i^{th}$ row vector of the base matrix, and the row vector $r_i$ does not include a part (0,−1,−1,−1,−1,−1,−1,−1,−1,−1,−1) a dual diagonal in the $i^{th}$ row. The row vector $r_i$ is determined in the form of a dual diagonal according to the size of the matrix determined after leading rows are added. For example, in FIG. 3, $r_1$=(−1, 94, 73, −1, −1, −1, −1, −1, 55, 83, −1, −1). The operation of deleting punctured parity nodes for the B-LDPC codeword is performed as follows.

Deleting punctured parity node of $G_p(2)$ can be expressed as Equation (8):

$$r'_1 = r_1 \emptyset r_2 \quad (8)$$

In Equation (8), $r'_1$ denotes an $i^{th}$ row vector of a child parity check matrix, $r_1$ denotes a first row vector of a mother parity check matrix, and $r_2$ denotes a second row vector of the mother parity check matrix. In addition, Ø indicates an operation for each individual element in the vector, and can be expressed as Equation (9):

$$-1 \emptyset -1 = -1$$

$$-1 \emptyset a = a$$

$$a \emptyset b = (a,b) \quad (9)$$

In Equation (9), 'a' and 'b' indicate positive integers, and (a,b) indicates that positions of '1's existing in the first row vector are 'a' and 'b', and the next row vector, i.e. the second row vector, is right-cyclically-shifted from the first row vector. In addition, (a,b) indicates the sum per row between elements in the same position of a permutation matrix associated with parameter 'a' and a permutation matrix associated with parameter 'b'.

For example, if it is assumed that a=3, b=5, and a size of the permutation matrix is 5×5, aØb=(a,b) can be expressed as Equation (10):

$$\begin{pmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 0 \end{pmatrix} \emptyset \begin{pmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{pmatrix} = \begin{pmatrix} 0 & 0 & 1 & 0 & 1 \\ 1 & 0 & 0 & 1 & 0 \\ 0 & 1 & 0 & 0 & 1 \\ 1 & 0 & 1 & 0 & 0 \\ 0 & 1 & 0 & 1 & 0 \end{pmatrix} \quad (10)$$

In this case, a base matrix for decoding the punctured B-LDPC codeword with coding rate=⅔ is generated as Equation (11):

$$r'_i = r_{2i-1} \emptyset r_{2i}, i=1,2,3,4,5,6 \quad (11)$$

In Equation (11), $r'_i$ denotes an $i^{th}$ row vector of a child parity check matrix, $r_{2i-1}$ denotes a $(2i-1)^{th}$ row vector of a mother parity check matrix, and $r_{2i}$ denotes a $(2i)^{th}$ row vector of the mother parity check matrix.

The base matrix generated using Equation (11) will now be described with reference to FIG. 4.

FIG. 4 is a diagram illustrating a parity check matrix of a punctured B-LDPC codeword with coding rate=⅔ generated by applying a puncturing scheme to a general B-LDPC codeword with coding rate=½.

The parity check matrix of a punctured B-LDPC codeword with coding rate=⅔ is generated by operating row vectors corresponding to parity nodes punctured in a parity check matrix of a general B-LDPC codeword with coding rate=½ which is shown in FIG. 3. The operation between row vectors corresponding to the punctured parity nodes has been described in detail above. Because the parity check matrix with the removed punctured parity nodes is similarly generated as depicted in FIG. 3 and explained above, decoding on the punctured B-LDPC codeword with coding rate=⅔, compared with decoding on the general B-LDPC codeword with coding rate=⅔ prevents the problems of increased number of calculations and the decrease in the decoding convergence speed.

The operation of generating the punctured B-LDPC codeword with coding rate=⅔ by applying the puncturing scheme to the general B-LDPC codeword with coding rate ½ has been described so far. Next, a description will be made of an operation of generating a punctured B-LDPC codeword with coding rate=⅘ by applying the puncturing scheme to the general B-LDPC codeword with coding rate ½.

If the puncturing scheme is applied, ⅘ of parity bits of the general B-LDPC codeword with coding rate=½ should be punctured, and the puncturing pattern for guaranteeing the excellent performance of the punctured B-LDPC codeword with coding rate=⅘ can be expressed as Equation (12):

$$G_p(4i)=0, i=1,2,3$$

$$G_p(4i-1)=0, i=1,2,3$$

$$G_p(4i-2)=0, i=1,2,3 \quad (12)$$

In this case, a base matrix for decoding the punctured B-LDPC codeword with coding rate=⅘ is generated as shown in Equation (13):

$$r'_i = r_{2i-1} \oplus r_{2i}, i=1,2,3 \quad (13)$$

The base matrix generated using Equation (13) will now be described with reference to FIG. 5.

FIG. 5 shows a parity check matrix of a punctured B-LDPC codeword with coding rate=⅘ generated by applying a puncturing scheme to a general B-LDPC codeword with coding rate=½.

Figure 6:
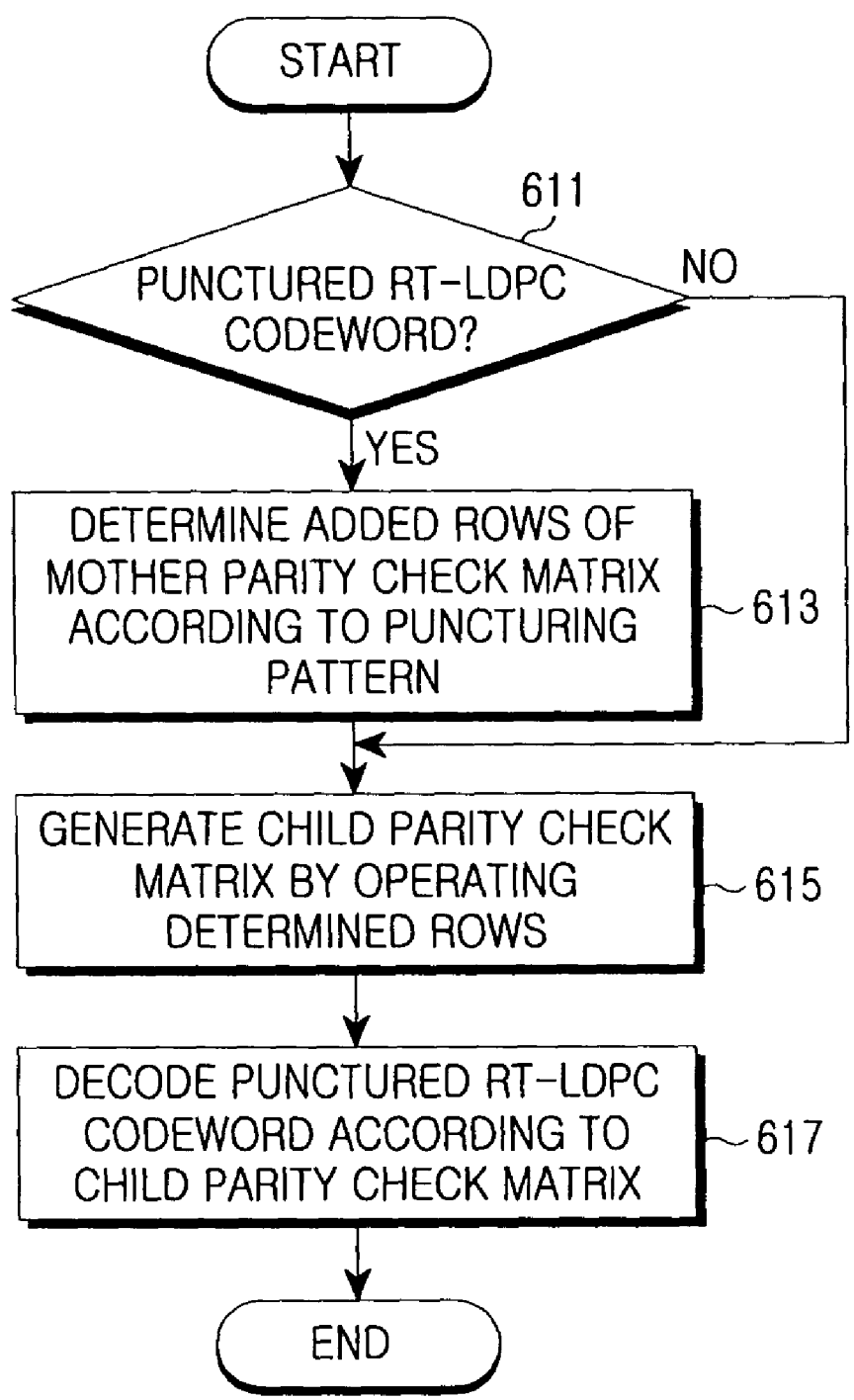
FIG. 6 is a flowchart illustrating an operation of decoding a punctured RT-LDPC codeword according to the present invention.

The parity check matrix of a punctured B-LDPC codeword with coding rate=⅘ is generated by operating row vectors corresponding to parity nodes punctured in a parity check matrix of a general B-LDPC codeword with coding rate=½ which is shown in FIG. 3. The operation between row vectors corresponding to the punctured parity nodes has been described in detail above. Because the parity check matrix with the removed punctured parity nodes is similarly generated as depicted in FIG. 3 and explained above, decoding on the punctured B-LDPC codeword with coding rate=⅘, compared with decoding on the general B-LDPC codeword with coding rate=⅘, prevents the problems of increased number of calculations and the decrease in the decoding convergence speed FIG. 6 is a flowchart illustrating an operation of decoding a punctured RT-LDPC codeword according to the present invention.

Next, with reference to FIG. 6, the description will be made of an operation of decoding a punctured RT-LDPC codeword according to the present invention.

The RT-LDPC decoding apparatus determines in step 611 if an input RT-LDPC codeword is a punctured RT-LDPC codeword. The RT-LDPC decoding apparatus can check if the input RT-LDPC codeword is a punctured RT-LDPC codeword using a coding rate at the corresponding time, which is previously known through exchange of control information between a transmitter and a receiver. If it is determined that the input RT-LDPC codeword is the punctured RT-LDPC codeword, the RT-LDPC decoding apparatus proceeds to step 613. In step 613, in order to generate a parity check matrix, i.e. a child parity check matrix for decoding the punctured RT-LDPC codeword, the RT-LDPC decoding apparatus determines the rows to be added in a parity check matrix of a mother codeword, i.e. a mother parity check matrix, previously stored in its internal memory according to a puncturing pattern applied in a transmitter's RT-LDPC encoding apparatus corresponding to the RT-LDPC decoding apparatus.

In step 615, the RT-LDPC decoding apparatus generates the child parity check matrix by determining the rows to be added in the parity check matrix. The operation of determining rows to be added in the mother parity check matrix according to the puncturing pattern, and generating the child parity check matrix by operating the determined rows has been described with reference to FIG. 3 and FIG. 5, so a detailed description thereof will be omitted. In step 617, the RT-LDPC apparatus decodes the punctured B-LDPC codeword according to the child parity check matrix.

Figure 7:
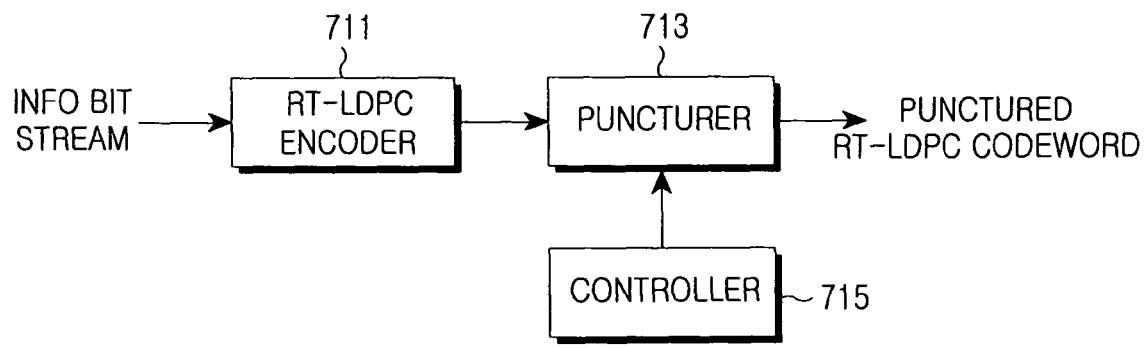
FIG. 7 is a diagram illustrating an internal structure of an RT-LDPC encoding apparatus according to the present invention.

FIG. 7 is a diagram illustrating an internal structure of an RT-LDPC encoding apparatus according to the present invention Now, with reference to FIG. 7, the description will be made of an internal structure of an RT-LDPC encoding apparatus according to the present invention.

The RT-LDPC encoding apparatus includes an RT-LDPC encoder 711, a puncturer 713, and a controller 715. Upon receipt of transmission information bits, i.e. information bit stream, the RT-LDPC encoder 711 encodes the input information bit stream according to a coding rate, generates an RT-LDPC codeword, or a mother codeword, and outputs the generated RT-LDPC codeword to puncturer 713. The coding rate set in the RT-LDPC encoder 711 is a coding rate for generating the mother codeword supported by the RT-LDPC encoding apparatus. Therefore, the RT-LDPC codeword output from the RT-LDPC encoder 711 is a general RT-LDPC codeword.

Puncturer 713 generates a punctured RT-LDPC codeword by puncturing parity bits from the general RT-LDPC codeword output from RT-LDPC encoder 711 under the control of controller 715. Controller 715 determines a coding rate that the RT-LDPC encoding apparatus should support at the present time, determines a puncturing pattern for the parity bits that it should puncture from the general RT-LDPC codeword to support the determined coding rate, and then outputs the determined puncturing pattern to puncturer 713. The operation of determining the puncturing pattern has been described above.

A receiver's RT-LDPC decoding apparatus as described in FIG. 7 decodes the punctured RT-LDPC codeword generated by the transmitter's RT-LDPC encoding apparatus.

Figure 8:
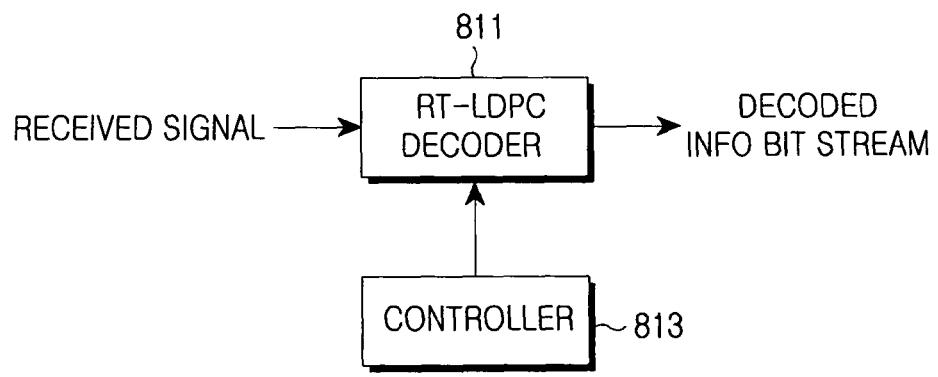
FIG. 8 is a diagram illustrating shows an internal structure of an RT-LDPC decoding apparatus according to the present invention.

FIG. 8 is a diagram illustrating an internal structure of an RT-LDPC decoding apparatus according to an embodiment of the present invention.

With reference to FIG. 8, a description will now be made of an internal structure of an RT-LDPC decoding apparatus according to the present invention.

The RT-LDPC decoding apparatus includes an RT-LDPC decoder 811 and a controller 813.

The encoded punctured RT-LDPC codeword transmitted from the transmitter's RT-LDPC encoding apparatus is received at a receiver's RT-LDPC decoding apparatus through a wireless channel. If the punctured RT-LDPC codeword is input to the RT-LDPC decoding apparatus, controller 813 generates a child parity check matrix to be used for decoding the punctured RT-LDPC codeword, using a mother parity check matrix corresponding to a coding rate applied in RT-LDPC encoder 711 of the RT-LDPC encoding apparatus and the puncturing pattern. Controller 813 outputs the generated child parity check matrix so that RT-LDPC decoder 811 may perform a decoding operation according to the child parity check matrix. Controller 813 recognizes only the mother parity check matrix and the puncturing pattern, and can generate the child parity check matrix using the other parity check matrix and the puncturing pattern. Therefore, controller 813 has no need to separately store the child parity check matrix in an internal memory, preventing unnecessary increase in the memory capacity due to the storage of the child parity check matrix.

The punctured RT-LDPC codeword is input to RT-LDPC decoder 811, and RT-LDPC decoder 811 decodes the input punctured RT-LDPC codeword according to the child parity check matrix provided from controller 813, and outputs the restored information bit stream, i.e. information bits.

A detailed description of the decoding operation of the RT-LDPC decoding apparatus will now be made for an exemplary case of decoding a punctured B-LDPC codeword with coding rate=$2/3$, generated by puncturing a general B-LDPC codeword with coding rate=$1/2$ generated according to a mother parity check matrix as shown in FIG. 3.

It can be understood that in a Tanner graph of the punctured B-LDPC codeword with coding rate=$2/3$, a first check node is connected to 8 information nodes, and positions of the information nodes are matched to positions of the information nodes existing in the first and second rows of a parity check matrix of the general B-LDPC codeword with coding rate=$1/2$. That is, the positions of the information nodes connected to each check node in the Tanner graph of the punctured B-LDPC codeword with coding rate=$2/3$ can be obtained from the parity check matrix of the general B-LDPC codeword with coding rate=$1/2$. Therefore, once the rows being grouped, i.e. added, according to the puncturing pattern applied to the general B-LDPC codeword with coding rate=$1/2$ are determined, to generate the punctured B-LDPC codeword with coding rate=$2/3$ positions of the information nodes connected to each check node in the Tanner graph of the punctured B-LDPC codeword with coding rate=$2/3$ can be obtained from the parity check matrix of the general B-LDPC codeword with coding rate=$1/2$. In addition, the rows grouped in the parity check matrix of the general B-LDPC codeword with coding rate=$1/2$ can be determined depending on the puncturing pattern.

Although only the structures associated with operations of generating the punctured RT-LDPC codeword and decoding the punctured RT-LDPC codeword have been described in reference to FIGS. 7 and 8, an operation of transmitting/receiving the punctured RT-LDPC code may be equivalent to the signal transmission/reception operation in the general communication system. Therefore, although not separately illustrated herein, the RT-LDPC encoding apparatus and the RT-LDPC decoding apparatus provided by the present invention can be applied to the transmitter/receiver of the general communication system.

Figure 9:
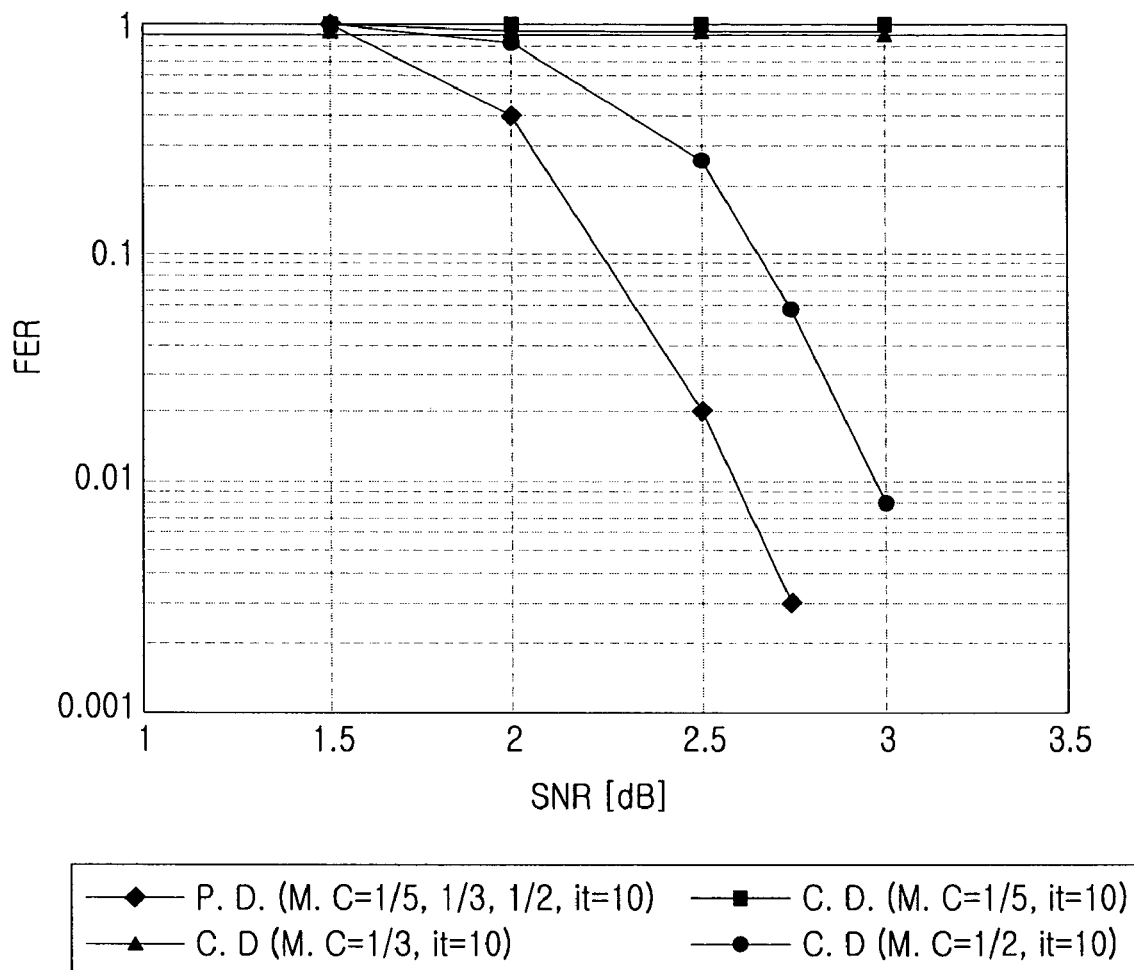
FIG. 9 is a graph illustrating performance comparison between the novel RT-LDPC decoding and the conventional RT-LDPC decoding for iteration=10.

FIG. 9 is a graph depicting the performance comparison between the novel RT-LDPC decoding and the conventional RT-LDPC decoding for iteration=10.

Next, with reference to FIGS. 9 to 11, a description will be made of RT-LDPC decoding performance according to the present invention.

In FIG. 9, performances of the novel RT-LDPC decoding and the conventional RT-LDPC decoding are shown for the number of iterations (it)=10 and the coding rates of $1/2$ (M.C=$1/2$), $1/3$ (M.C=$1/3$), and $1/5$ (M.C=$1/5$). It can be noted from FIG. 9 that the novel RT-LDPC decoding is most superior in terms of performance. In FIG. 9, a novel RT-LDPC decoding performance curve is indicated by P.D, and the conventional RT-LDPC decoding performance curves is shown by C.D.

Figure 10:
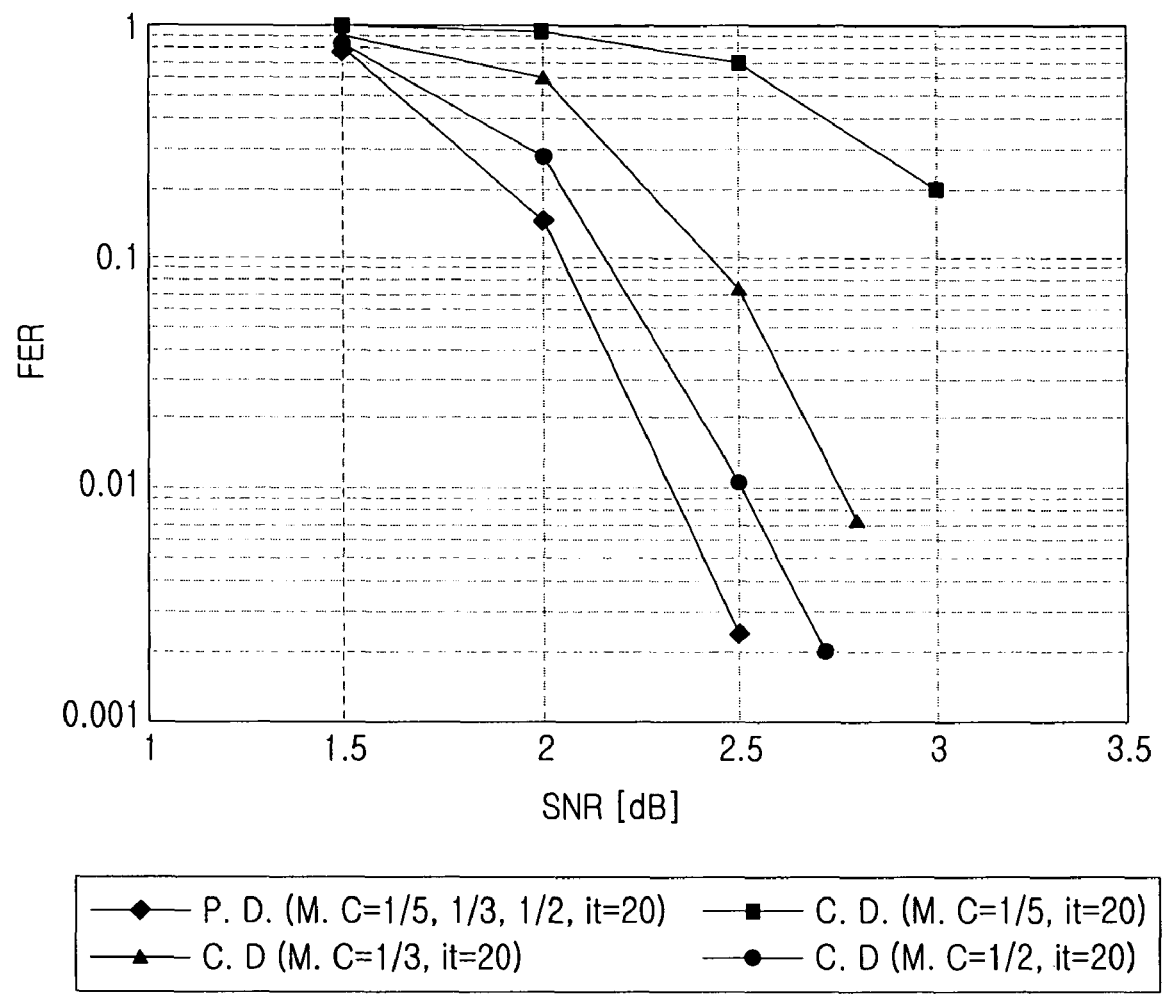
FIG. 10 is a graph illustrating performance comparison between the novel RT-LDPC decoding and the conventional RT-LDPC decoding for iteration=20.

FIG. 10 is a graph illustrating the performance comparison between the novel RT-LDPC decoding and the conventional RT-LDPC decoding for iteration=20.

In FIG. 10, performances of the novel RT-LDPC decoding and the conventional RT-LDPC decoding are shown for the number of iterations (it)=20 and the coding rates of $1/2$ (M.C=$1/2$), $1/3$ (M.C=$1/3$), and $1/5$ (M.C=$1/5$). It can be noted from FIG. 10 that the novel RT-LDPC decoding is most superior in terms of performance. In FIG. 10, a novel RT-LDPC decoding performance curve is indicated by P.D, and the conventional RT-LDPC decoding performance curves is shown by C.D.

Figure 11:
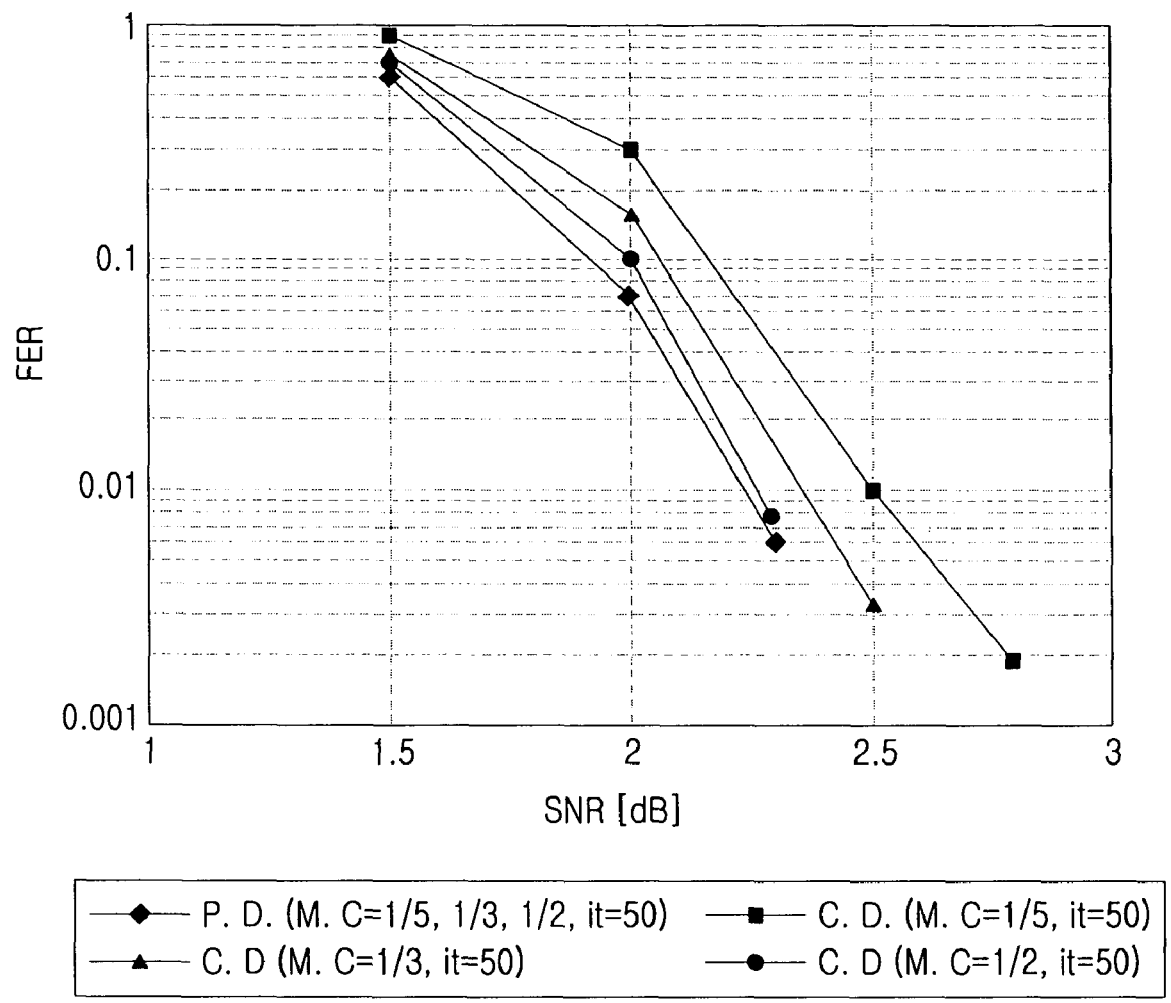
FIG. 11 is a graph illustrating performance comparison between the novel RT-LDPC decoding and the conventional RT-LDPC decoding for iteration=50.

FIG. 11 depicts the performance comparison between the novel RT-LDPC decoding and the conventional RT-LDPC decoding for iteration=50.

In FIG. 11, performances of the novel RT-LDPC decoding and the conventional RT-LDPC decoding are shown for the number of iterations (it)=50 and the coding rates of $1/2$ (M.C=$1/2$), $1/3$ (M.C=$1/3$), and $1/5$ (M.C=$1/5$). It can be noted from FIG. 11 that the novel RT-LDPC decoding is most superior in terms of the performance. In FIG. 11, a novel RT-LDPC decoding performance curve is indicated by P.D, and the conventional RT-LDPC decoding performance curves is shown by C.D.

As can be understood from the foregoing description, the present invention removes punctured parity nodes in decoding the punctured RT-LDPC codeword used for supporting a variable coding rate in a communication system using the RT-LDPC code, thereby preventing the increase in the number of calculations for decoding and the decrease in the decoding convergence speed.

While the invention has been shown and described with reference to a certain preferred embodiment thereof, it will be understood by those skilled in the art that various changes in form and details may be made therein without departing from the spirit and scope of the invention as further defined by the appended claims.

What is claimed is:

1. A decoding method in a communication system using a Low Density Parity Check (LDPC) code, the method comprising:

determining whether an LDPC codeword to be decoded is a general LDPC codeword to which a puncturing scheme is not applied or a punctured LDPC codeword to which the puncturing scheme is applied;

if the LDPC codeword to be decoded is the punctured LDPC codeword, generating a child parity check matrix using a mother parity check matrix indicative of a parity check matrix of the general LDPC codeword, and a puncturing pattern applied to the punctured LDPC codeword; and decoding the punctured LDPC codeword using the child parity check matrix;

wherein generating the child parity check matrix comprises generating a Tanner graph of the punctured LDPC codeword by deleting parity nodes corresponding to parity bits punctured to generate the punctured LDPC codeword from the general LDPC codeword in a Tanner graph of the general LDPC codeword, and generating the child parity check matrix using the Tanner graph of the punctured LDPC codeword; and wherein deleting parity nodes corresponding to parity bits punctured to generate the punctured LDPC codeword comprises adding each of remaining parity nodes except for parity nodes corresponding to the punctured parity bits of a first parity node corresponding to a non-punctured parity bit preceding the remaining parity node, and all information nodes connected between the first parity node and the remaining parity node in the Tanner graph of the general LDPC codeword.

2. The decoding method of claim 1, wherein deleting parity nodes corresponding to parity bits punctured to generate the punctured LDPC codeword is performed to satisfy:

$$p(j+1) = p(j-t) + \sum_{i=1}^{n-2}(g(i,j) + g(i,j-1) + \ldots + g(i,j-t)) \bmod 2$$

where $p(j)$ denotes a $j^{th}$ parity bit, $g(i,j)$ denotes a $j^{th}$ information node among the information nodes connected to an $i^{th}$ check node, and 'n' denotes a degree of the $i^{th}$ check node, and 'mod' denotes a modulo operation.

3. The decoding method of claim 1, wherein generating a child parity check matrix comprises generating the child parity check matrix by operating row vectors included in the mother parity check matrix according to the puncturing pattern if the LDPC code is a block LDPC (B-LDPC) code.

4. The decoding method of claim 1, further comprising:
generating the child parity check matrix by operating row vectors included in the mother parity check matrix according to the puncturing pattern defined as $$G_p(2i)=0, i=1,2,3,4,5,6$$

where $G_p(2i)$ denotes a parity group corresponding to a $(2i)^{th}$ row of the mother parity check matrix, and $G_p(2i)=0$ indicates that all parity bits in the Gp(2i) are punctured if the general LDPC codeword is a B-LDPC codeword with coding rate=½, the punctured LDPC codeword is a punctured B-LDPC codeword with coding rate=⅔, the mother parity check matrix includes a plurality of permutation matrixes, and parity bits of the B-LDPC codeword with coding rate=½ are grouped in 12 parity bits, the step of generating a child parity check matrix.

5. The decoding method of claim 4, wherein operating row vectors included in the mother parity check matrix according to the puncturing pattern is performed according to:

$$r'_i = r_{2i-1} \emptyset r_{2i}, i=1,2,3,4,5,6$$

where $r'_i$ denotes an $i^{th}$ row vector of the child parity check matrix, $r_{2i-1}$ denotes a $(2i-1)^{th}$ row vector of the mother parity check matrix, $r_{2i}$ denotes a $(2i)^{th}$ row vector of the mother parity check matrix, and $\emptyset$ denotes an operation for each individual element in the vector, and is expressed as $$-1\emptyset-1=-1$$

$$-1\emptyset a=a$$

$$a\emptyset b=(a,b)$$

where 'a' and 'b' indicate positive integers, and (a,b) indicates that positions of '1's existing in a first row vector are 'a' and 'b' and the next row vector is right-cyclically-shifted from the first row vector, and further indicates a sum per row between elements in the same position of a permutation matrix associated with parameter 'a' and a permutation matrix associated with parameter 'b'.

6. The decoding method of claim 1, further comprising:
generating the child parity check matrix by operating row vectors included in the mother parity check matrix according to the puncturing pattern defined as $$Gp(4i)=0, i=1,2,3$$

$$Gp(4i-1)=0, i=1,2,3$$

$$Gp(4i-2)=0, i=1,2,3$$

where $G_p(4i)$ denotes a parity group corresponding to a $(4i)^{th}$ row of the mother parity check matrix, and $G_p(4i)=0$ indicates that all parity bits in the Gp(4i) are punctured if the general LDPC codeword is a B-LDPC codeword with coding rate=½, the punctured LDPC codeword is a punctured B-LDPC codeword with coding rate=⅘, the mother parity check matrix includes a plurality of permutation matrixes, and parity bits of the B-LDPC codeword with coding rate=½ are grouped in 12 parity bits, the step of generating a child parity check matrix.

7. The decoding method of claim 6, wherein operating row vectors included in the mother parity check matrix according to the puncturing pattern is performed according to:

$$r'_i = r_{2i-1} \emptyset r_{2i}, i=1,2,3$$

where $r'_i$ denotes an $i^{th}$ row vector of the child parity check matrix, $r_{2i-1}$ denotes a $(2i-1)^{th}$ row vector of the mother parity check matrix, $r_{2i}$ denotes a $(2i)^{th}$ row vector of the mother parity check matrix, and $\emptyset$ denotes an operation for each individual element in the vector, and is expressed as $$-1\emptyset-1=-1$$

$$-1\emptyset a=a$$

$$a\emptyset b=(a,b)$$

where 'a' and 'b' indicate positive integers, and (a,b) indicates that positions of '1's existing in a first row vector are 'a' and 'b' and the next row vector is right-cyclically-shifted from the first row vector, and further indicates a sum per row between elements in the same position of a permutation matrix associated with parameter 'a' and a permutation matrix associated with parameter 'b'.

8. A decoding apparatus in a communication system using a Low Density Parity Check (LDPC) code, the apparatus comprising:
a controller for determining whether an LDPC codeword to be decoded is a general LDPC codeword to which a puncturing scheme is not applied or a punctured LDPC codeword to which the puncturing scheme is applied, and if the LDPC codeword to be decoded is the punctured LDPC codeword generating a child parity check matrix using a mother parity check matrix indicative of a parity check matrix of the general LDPC codeword, and a puncturing pattern applied to the punctured LDPC codeword; and
an LDPC decoder for decoding the punctured LDPC codeword using the child parity check matrix;
wherein the controller deletes parity nodes corresponding to parity bits punctured to generate a Tanner graph of the punctured LDPC codeword and the punctured LDPC codeword from the general LDPC codeword in a Tanner graph of the general LDPC codeword, and generates the child parity check matrix using the Tanner graph of the punctured LDPC codeword; and wherein the controller deletes parity nodes corresponding to parity bits punctured to generate the punctured LDPC codeword which is achieved by adding each of remaining parity nodes except for parity nodes corresponding to the punctured parity bits to a first parity node corresponding to a non-punctured parity bit preceding the remaining parity node, and all information nodes connected between the first parity node and the remaining parity node in the Tanner graph of the general LDPC codeword.

9. The decoding apparatus of claim 8, wherein the controller deletes parity nodes corresponding to parity bits punctured to generate the punctured LDPC codeword according:

$$p(j+1) = p(j-t) + \sum_{i=1}^{n-2} (g(i,j) + g(i,j-1) + \ldots + g(i,j-t)) \bmod 2$$

where p(j) denotes a $j^{th}$ parity bit, g(i,j) denotes a $j^{th}$ information node among the information nodes connected to an $i^{th}$ check node, and 'n' denotes a degree of the $i^{th}$ check node, and 'mod' denotes a modulo operation.

10. The decoding apparatus of claim 8, wherein if the LDPC code is a block LDPC (B-LDPC) code, the controller generates the child parity check matrix by operating row vectors included in the mother parity check matrix according to the puncturing pattern.

11. The decoding apparatus of claim 8, wherein the controller generates the child parity check matrix by operating row vectors included in the mother parity check matrix according to the puncturing pattern defined as $G_p(2i)=0, i=1,2,3,4,5,6$ where $G_p(2i)$ denotes a parity group corresponding to a $(2i)^{th}$ row of the mother parity check matrix, and $G_p(2i)=0$ indicates that all parity bits in the Gp(2i) are punctured if the general LDPC codeword is a B-LDPC codeword with coding rate=½, the punctured LDPC codeword is a punctured B-LDPC codeword with coding rate=⅔, the mother parity check matrix includes a plurality of permutation matrixes, and parity bits of the B-LDPC codeword with coding rate=½ are grouped in 12 parity bits.

12. The decoding apparatus of claim 11, wherein the controller operates row vectors included in the mother parity check matrix according to the puncturing pattern using:

r'$_i$=r$_{2i-1}$Ør$_{2i}$, i=1,2,3,4,5,6 where r'$_i$ denotes an $i^{th}$ row vector of the child parity check matrix, r$_{2i-1}$ denotes a $(2i-1)^{th}$ row vector of the mother parity check matrix, r$_{2i}$ denotes a $(2i)^{th}$ row vector of the mother parity check matrix, and Ø denotes an operation for each individual element in the vector, and is expressed as

−1Ø−1=−1

−1Øa=a aØb=(a,b)

where 'a' and 'b' indicate positive integers, and (a,b) indicates that positions of '1's existing in a first row vector are 'a' and 'b' and the next row vector is right-cyclically-shifted from the first row vector, and further indicates a sum per row between elements in the same position of a permutation matrix associated with parameter 'a' and a permutation matrix associated with parameter 'b'.

13. The decoding apparatus of claim 8, wherein the controller generates the child parity check matrix by operating row vectors included in the mother parity check matrix according to the puncturing pattern defined as Gp(4i)=0, i=1,2,3

Gp(4i−1)=0, i=1,2,3

Gp(4i−2)=0, i=1,2,3 where $G_p(4i)$ denotes a parity group corresponding to a $(4i)^{th}$ row of the mother parity check matrix, and $G_p(4i)=0$ indicates that all parity bits in the Gp(4i) are punctured if the general LDPC codeword is a B-LDPC codeword with coding rate=½, the punctured LDPC codeword is a punctured B-LDPC codeword with coding rate=⅘, the mother parity check matrix includes a plurality of permutation matrixes, and parity bits of the B-LDPC codeword with coding rate=½ are grouped in 12 parity bits.

14. The decoding apparatus of claim 13, wherein the controller operates row vectors included in the mother parity check matrix according to the puncturing pattern using:

r'$_i$=r$_{2i-1}$Ør$_{2i}$, i=1,2,3 where r'$_i$ denotes an $i^{th}$ row vector of the child parity check matrix, r$_{2i-1}$ denotes a $(2i-1)^{th}$ row vector of the mother parity check matrix, r$_{2i}$ denotes a $(2i)^{th}$ row vector of the mother parity check matrix, and Ø denotes an operation for each individual element in the vector, and is expressed as

−1Ø−1=−1

−1Øa=a aØb=(a,b)

where 'a' and 'b' indicate positive integers, and (a,b) indicates that positions of '1's existing in a first row vector are 'a' and 'b' and the next row vector is right-cyclically-shifted from the first row vector, and further indicates a sum per row between elements in the same position of a permutation matrix associated with parameter 'a' and a permutation matrix associated with parameter 'b'.

* * * * *